(12) United States Patent
Cheng et al.

(10) Patent No.: US 12,170,114 B2
(45) Date of Patent: Dec. 17, 2024

(54) THREE-DIMENSIONAL MEMORY DEVICE AND METHOD FOR READING THE SAME

(71) Applicant: YANGTZE MEMORY TECHNOLOGIES CO., LTD., Wuhan (CN)

(72) Inventors: Ting Cheng, Wuhan (CN); Hongtao Liu, Wuhan (CN); Lei Jin, Wuhan (CN); Xiangnan Zhao, Wuhan (CN); Xuezhun Xie, Wuhan (CN); Shiyu Xia, Wuhan (CN); Yuanyuan Min, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 183 days.

(21) Appl. No.: 18/082,457

(22) Filed: Dec. 15, 2022

(65) Prior Publication Data

US 2023/0120129 A1   Apr. 20, 2023

Related U.S. Application Data

(63) Continuation of application No. PCT/CN2021/130274, filed on Nov. 12, 2021.

(30) Foreign Application Priority Data

Jan. 6, 2021   (CN) .......................... 202110013950.8

(51) Int. Cl.
*G11C 7/00*   (2006.01)
*G11C 11/00*   (2006.01)
(Continued)

(52) U.S. Cl.
CPC ............ *G11C 16/102* (2013.01); *G11C 16/24* (2013.01); *G11C 16/26* (2013.01); *G11C 16/3459* (2013.01)

(58) Field of Classification Search
CPC ....... G11C 16/102; G11C 16/24; G11C 16/26; G11C 16/3459; G11C 16/3418;
(Continued)

(56) References Cited

U.S. PATENT DOCUMENTS 11,935,596 B2 *   3/2024   Wang ..................... G11C 16/24
2016/0093390 A1   3/2016   Yuan et al.
(Continued)

FOREIGN PATENT DOCUMENTS

CN   108346447 A   7/2018
CN   112614531 A   4/2021

OTHER PUBLICATIONS

First Office action issued in corresponding Chinese Application No. 202110013950.8, mailed on Jul. 19, 2021, 3 pages.
(Continued)

*Primary Examiner* — Hien N Nguyen
(74) *Attorney, Agent, or Firm* — BAYES PLLC

(57) ABSTRACT

A three-dimensional (3D) memory device and method for reading the same are provided. The device includes memory cell strings each including multiple memory cells. In each memory cell string, a topmost memory cell is connected to a top selection gate connected to a bit line, and a bottommost memory cell is connected to a bottom selection gate. The method includes sequentially programming multiple memory cells in a memory cell string according to a programming sequence; in reading a memory cell, applying a corresponding bit line voltage to the memory cell string according to the programming sequence of the memory cell.

10 Claims, 6 Drawing Sheets

(51) Int. Cl.
    *G11C 16/10*    (2006.01)
    *G11C 16/24*    (2006.01)
    *G11C 16/26*    (2006.01)
    *G11C 16/34*    (2006.01)
(58) Field of Classification Search
    CPC ........ G11C 2211/5648; G11C 11/5628; G11C 11/5642; G11C 16/08; G11C 16/10; G11C 16/0483; G11C 16/3427; G11C 5/147; G11C 7/18; G11C 8/14; G11C 16/3431
    See application file for complete search history.

(56) References Cited

U.S. PATENT DOCUMENTS

| | | | |
|---|---|---|---|
| 2017/0236591 A1* | 8/2017 | Shimura | G11C 16/0483 365/185.12 |
| 2018/0047449 A1* | 2/2018 | Nam | G11C 16/3454 |
| 2019/0013078 A1 | 1/2019 | Lee | |
| 2019/0244674 A1* | 8/2019 | Lee | G11C 16/26 |
| 2020/0363983 A1* | 11/2020 | Li | G11C 16/0483 |
| 2023/0037884 A1* | 2/2023 | Vali | G11C 16/102 |
| 2023/0418742 A1* | 12/2023 | He | G06F 12/0292 |

OTHER PUBLICATIONS

International Search Report issued in corresponding International Application No. PCT/CN2021/130274, mailed on Feb. 10, 2022, 5 pages.
Written Opinion issued in corresponding International Application No. PCT/CN2021/130274, mailed on Feb. 10, 2022, 5 pages.

* cited by examiner

——— Threshold voltage distributions after only the memory cell MCn is programmed ------ Threshold voltage distributions of memory cells after all memory cells are programmed

THREE-DIMENSIONAL MEMORY DEVICE AND METHOD FOR READING THE SAME

CROSS-REFERENCE TO RELATED APPLICATIONS

This application is a continuation of International Application No. PCT/CN2021/130274 filed on Nov. 12, 2021, which claims the benefit of priority to Chinese Application No. 202110013950.8 filed on Jan. 6, 2021, the entire contents of which are hereby incorporated by reference in their entireties.

BACKGROUND

In recent years, flash memory devices have been particularly rapidly developed. Flash memory devices can keep stored information for a long time without power on, and have the advantages of high integration degree, fast access speed, easy erasing and rewriting, etc., and thus have been widely used in various fields such as microcomputers and automatic control. In order to further increase the bit density of flash memory devices and reduce the bit cost, three-dimensional flash memory device (3D NAND) technology has been rapidly developed.

SUMMARY

The disclosure relates to the field of semiconductor manufacturing processes, and in particular to a three-dimensional (3D) memory device and a method for reading the same.

According to an aspect of the disclosure, a method for reading a three-dimensional (3D) memory device is provided. The 3D memory device includes multiple memory cell strings, and each memory cell string includes multiple memory cells. A topmost memory cell in each memory cell string is connected to a top selection gate that is connected to a bit line, and a bottommost memory cell in each memory cell string is connected to a bottom selection gate. The method includes the following.

Multiple memory cells in one of the multiple memory cell strings are sequentially programmed according to a programming sequence. The multiple memory cells in one of the multiple memory cell strings are divided into multiple memory groups according to the programming sequence. A number of the multiple memory groups is less than or equal to a number of memory cells in the one of the multiple memory cell strings. In performing a reading operation on a memory cell in the one of the multiple memory cell strings, a corresponding bit line voltage is applied to the one of the multiple memory cell strings according to a programming sequence of a memory group to which the memory cell belongs.

The earlier the programming sequence of the memory group to which the memory cell belongs, the greater the corresponding bit line voltage applied to the one of the multiple memory cell strings during the reading operation.

According to another aspect of the disclosure, a three-dimensional (3D) memory device is provided. The 3D memory device includes: a memory cell array including multiple memory cell strings, each memory cell string including multiple memory cells. A topmost memory cell in each memory cell string is connected to a top selection gate that is connected to a bit line, and a bottommost memory cell in each memory cell string is connected to a bottom selection gate.

The 3D memory device includes a controller. The controller is electrically connected to the memory cell array, and is configured to: sequentially program multiple memory cells in one of the multiple memory cell strings according to a programming sequence. The controller is further configured to: divide the multiple memory cells in the one of the multiple memory cell strings into multiple memory groups according to the programming sequence, with a number of the multiple memory groups being less than or equal to a number of memory cells in the one of the multiple memory cell strings. In performing a reading operation on a memory cell in the one of the multiple memory cell strings, the controller is further configured to: apply a corresponding bit line voltage to the one of the multiple memory cell strings according to a programming sequence of a memory group to which the memory cell belongs.

The earlier the programming sequence of the memory group to which the memory cell belongs, the greater the bit line voltage applied to the one of the multiple memory cell strings during the controller performs the reading operation on the memory cell.

BRIEF DESCRIPTION OF THE DRAWINGS

The above and other objectives, features, and advantages of the disclosure will be more apparent from the description of embodiments of the disclosure with reference to the accompanying drawings.

DETAILED DESCRIPTION

Figure 1A:
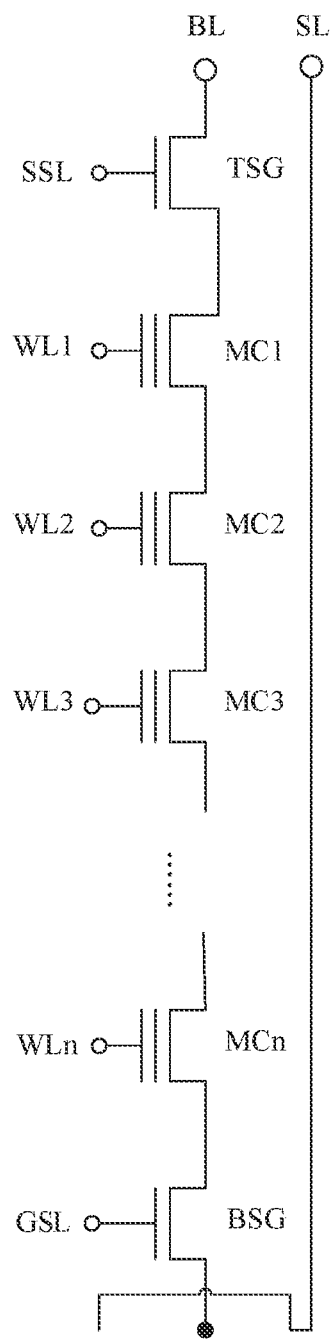
FIG. 1A illustrates a circuit diagram of a memory cell string in a 3D memory device.

Various embodiments of the disclosure will be described in more detail below with reference to the accompanying drawings. In the accompanying drawings, the same components are denoted by the same or similar reference signs. For the sake of clarity, the various parts in the drawings are not drawn to scale.

The disclosure will be described in further detail below in combination with the accompanying drawings and embodiments.

The term "above" used in the disclosure refers to being above the plane of the substrate, which may refer to direct contact between materials, or the materials being spaced apart from each other.

In the disclosure, "semiconductor structure" is a generic term for the entire semiconductor structure formed in various operations of manufacturing memory devices, including all layers or regions that have been formed. Many specific details of the disclosure, such as the structures, materials, sizes, processing processes, and techniques of the device are described below so that the disclosure will be understood more clearly. However, as will be appreciated by a person skilled in the art, the disclosure may not be implemented in accordance with these specific details.

The disclosure may be presented in various forms, and some examples will be described below.

In a particular application, a memory cell array includes multiple memory cell strings arranged in an array. In each layer, the memory cells of each row are connected to the same word line (WL), and the memory cell string in each column is connected to the same bit line (BL). By selecting a word line and a bit line in the memory cell array, a corresponding memory cell can be selected.

Figure 1B:
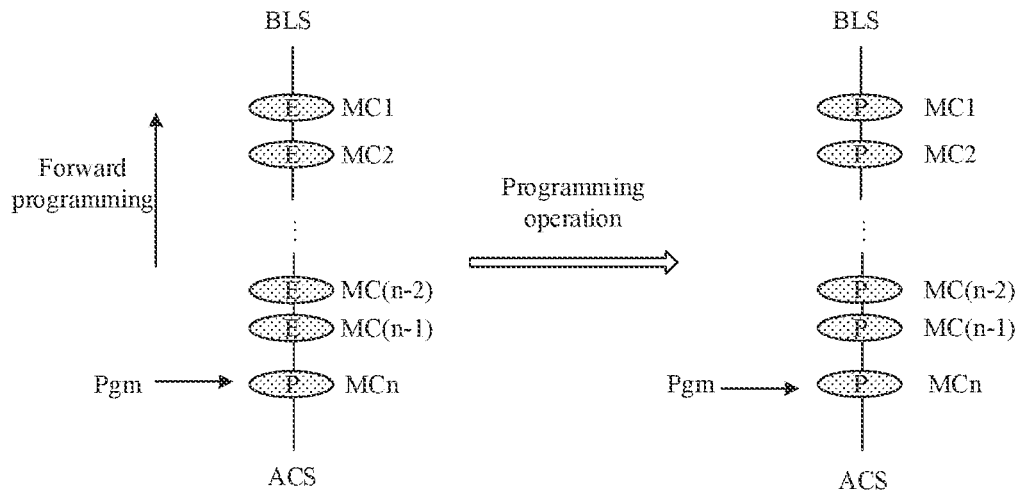
FIG. 1B illustrates a schematic diagram of operation states of memory cells during programming of a memory cell string.

FIG. 1A illustrates a circuit diagram of a memory cell string in a 3D memory device, and FIG. 1B illustrates a schematic diagram of operation states of memory cells during programming of a memory cell string. The memory cell string includes multiple memory cells (MC1-MCn), and n is an integer greater than or equal to 2. A topmost memory cell in each memory cell string is connected to a top selection gate (TSG) that is connected to a bit line, and a bottommost memory cell in each memory cell string is connected to a bottom selection gate (BSG).

For the programming process of 3D memory devices, a general programming sequence is to program from bottom to top, namely, to start programming from a memory cell closest to the bottom selection gate and end at a memory cell closest to the top selection gate. Such a programming sequence can be referred to as a normal programming sequence or a forward programming sequence.

Referring to FIG. 1B, before the memory cell string is programmed, all memory cells are set to an erased state E. Firstly, the memory cell MCn closest to the bottom selection gate is programmed. At this time, the other memory cells are in the erased state E, and the memory cell MCn is set to a programmed state P after being programmed. After all the memory cells on the memory cell string are programmed sequentially, the memory cells MC1-MCn are all set to the programmed state P. Due to the background pattern dependency (BPD) effect and the disturbance effect, the memory cells MC1-MCn may have slightly different threshold voltages (Vt). This causes the widening of the distribution of threshold voltages (that is, threshold voltage differences) of the memory cells. Increasing the threshold voltage difference between the memory cells may reduce the read margin in single-level cells or multi-level cells, and may have a negative effect on the margin in-cycling and retention characteristics.

Figure 2:
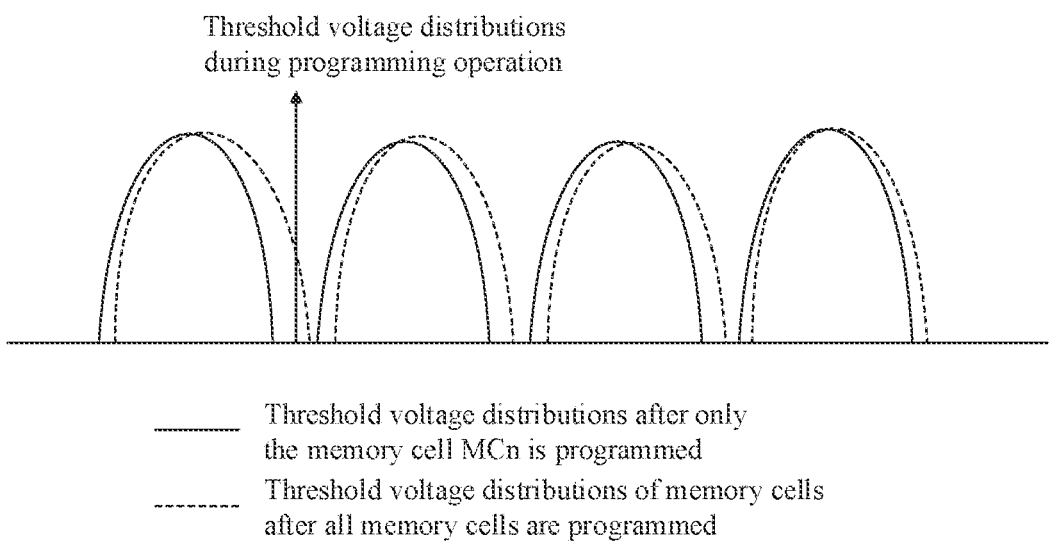
FIG. 2 illustrates threshold voltage distributions of memory cells caused by the background pattern dependency (BPD) effect.

FIG. 2 illustrates the threshold voltage distribution of memory cells caused by the BPD effect. Solid lines represent the threshold voltage distributions of the memory cells after the memory cell MCn is first programmed, and dashed lines represent the threshold voltage distributions of the memory cells after all memory cells are programmed in a forward sequence. When a memory cell programmed earlier is verified and read, the change in the resistance of the drain terminal causes a positive shift in the threshold voltage of the memory cell. A memory cell that is programmed earlier has a larger threshold voltage shift caused by the BPD effect.

Figure 3A:
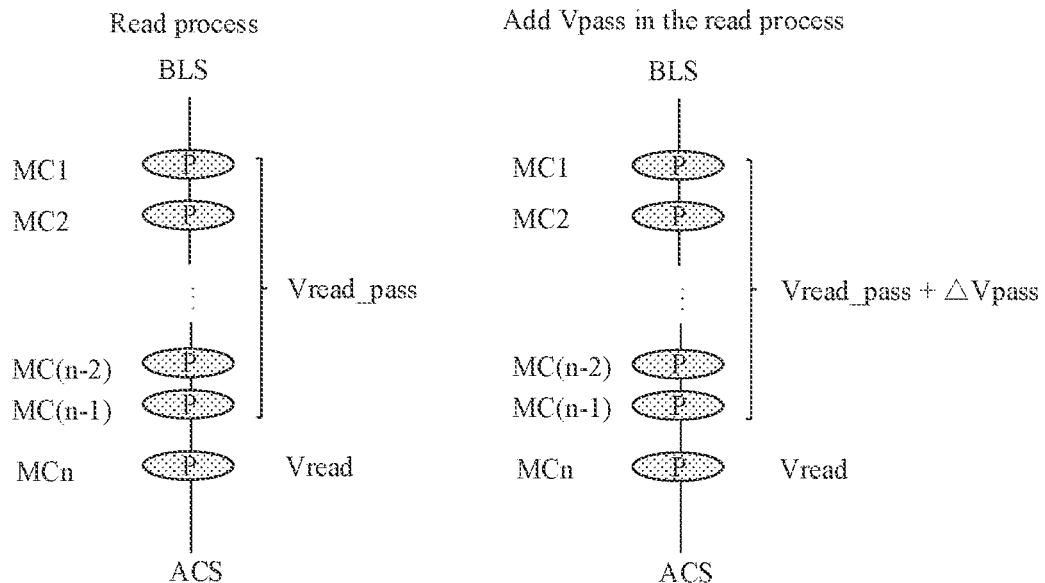
FIG. 3A illustrates a schematic diagram of a reading operation of a memory cell string.
Figure 3B:
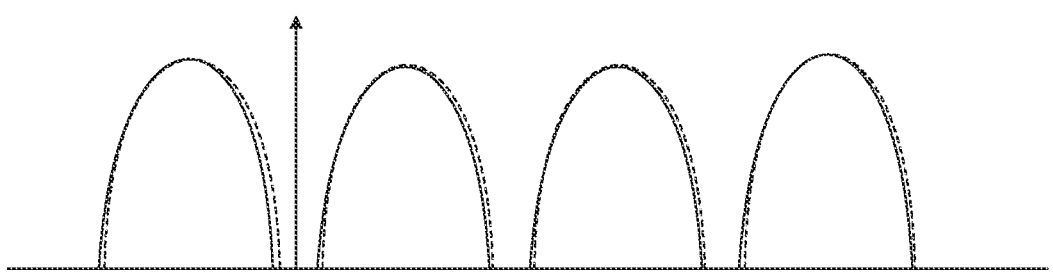
FIG. 3B illustrates the threshold voltage distributions of memory cells.

Referring to FIGS. 3a and 3b, in the reading process after the programming of the memory cell string, when the selected memory cell is read, the read voltage Vread is applied to the word line connected to the selected memory cell, and a pass voltage Vread_pass is applied to the word lines connected to other unselected memory cells. The BPD effect can be alleviated by increasing the pass voltage (Vread_pass) applied to the word lines connected to other unselected memory cells, that is, applying an increased pass voltage (Vread_pass+ΔVpass) to the word lines connected to other unselected memory cells. Although the threshold voltage shift caused by the BPD effect is reduced (as illustrated in FIG. 3B), read disturbance will be inevitably caused and the impact of read disturbance will be increased.

Figure 4:
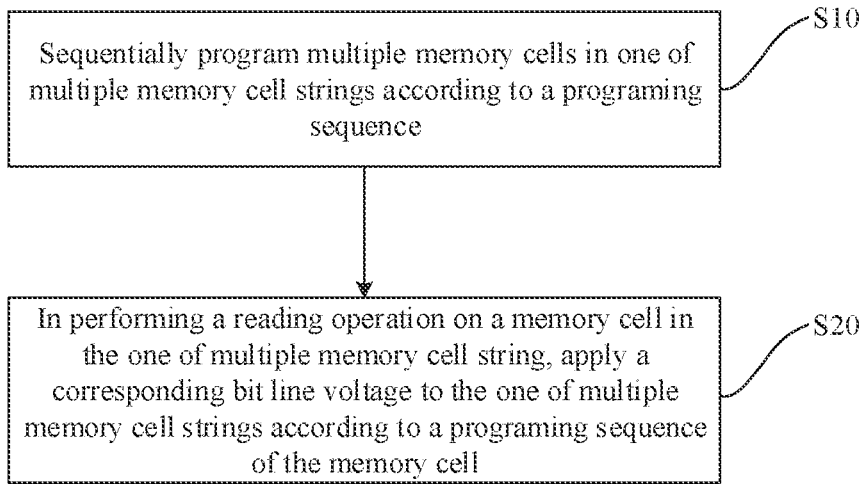
FIG. 4 illustrates a flowchart of a method for reading a 3D memory device according to embodiments of the disclosure.

FIG. 4 illustrates a flowchart of a method for reading a 3D memory device according to embodiments of the disclosure. As illustrated in FIG. 4, the method includes the following operations.

In S10, multiple memory cells in one of the multiple memory cell strings are sequentially programmed according to a programming sequence.

In this embodiment, a forward programming sequence is from bottom to top, namely, to start programming from a memory cell closest to a bottom selection gate (BSG) and end at a memory cell closest to a top selection gate (TSG), that is, successively programming from the memory cell adjacent to the bottom selection gate (BSG) to the memory cell adjacent to the top selection gate (TSG). A reverse programming sequence is from top to bottom, namely, to start programming from the memory cell closest to the top selection gate (TSG) and end at the memory cell closest to the bottom selection gate (BSG), that is, successively programming from the memory cell adjacent to the top selection gate (TSG) to the memory cell adjacent to the bottom selection gate (BSG).

In S20, in performing a reading operation on a memory cell in the one of the multiple memory cell strings, a corresponding bit line voltage is applied to the one of the multiple memory cell strings according to a programming sequence of the memory cell.

In this embodiment, the earlier the programming sequence of a memory cell, the greater the bit line voltage applied to the memory cell string during the reading operation. When the selected memory cell is read, a read voltage Vread is applied to the word line connected to the selected memory cell, and a pass voltage Vread_Pass is applied to the word lines connected to the other unselected memory cells.

Figure 5:
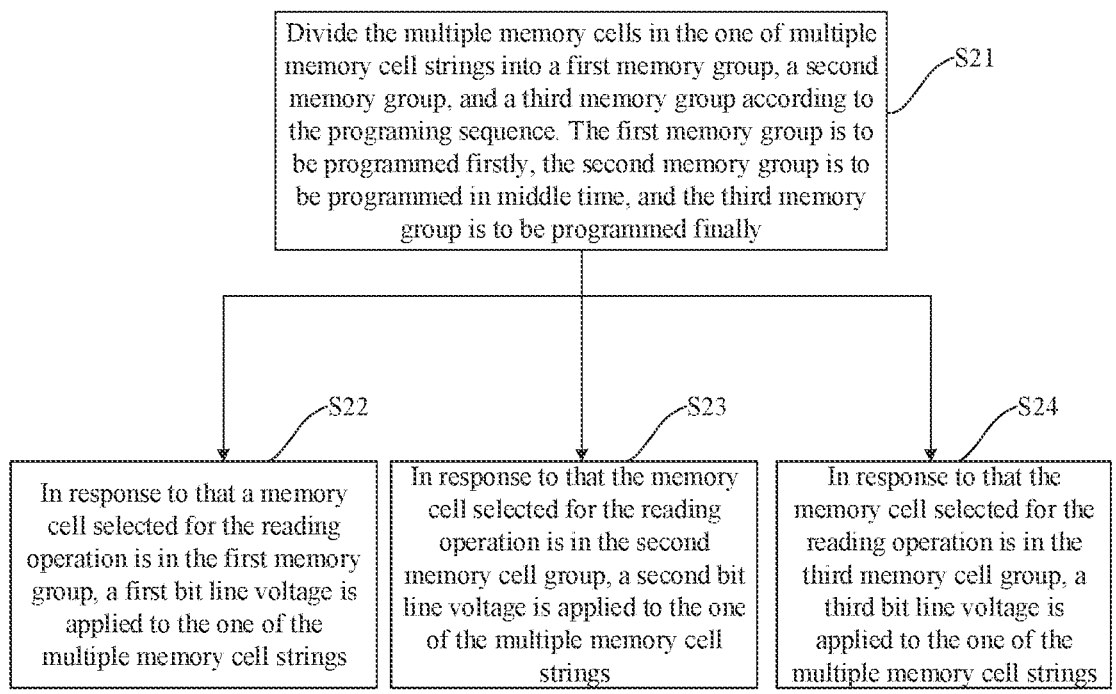
FIG. 5 illustrates a flowchart of operation S20 illustrated in FIG. 4.

In an exemplary embodiment, S20 includes operations S21-S24, please refer to FIG. 5.

In S21, the multiple memory cells in the one of the multiple memory cell strings are divided into a first memory group, a second memory group, and a third memory group according to the programming sequence. The first memory group is to be programmed first, and the third memory group is to be programmed finally. The second memory group is to be programmed between the first memory group and the third memory group in time.

Figure 6A:
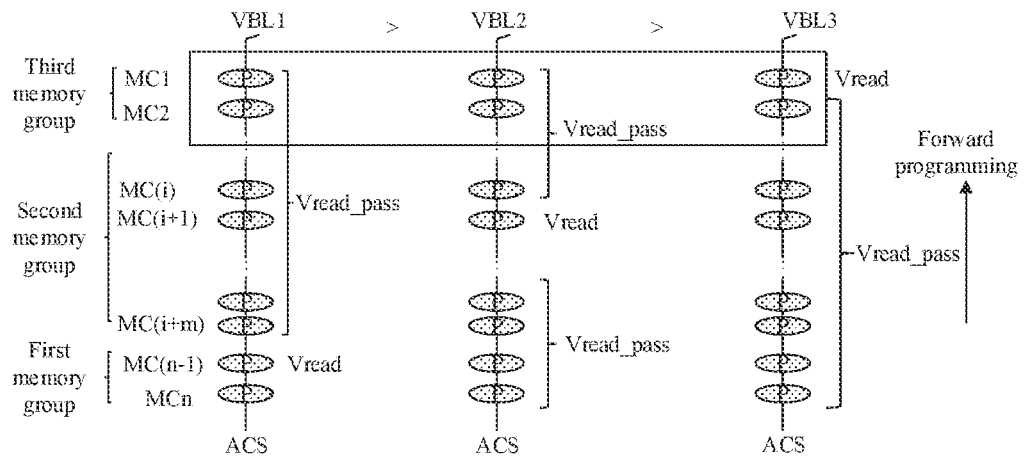
FIG. 6A illustrates a schematic diagram of a reading operation performed after forward programming of a memory cell string according to embodiments of the disclosure.

In this embodiment, when the programming sequence is a forward programming sequence, the first memory group is close to the bottom selection gate (BSG), and the third memory group is close to the top selection gate (TSG). The closer to the bottom selection gate (BSG) the memory cell selected for the reading operation, the greater the bit line voltage applied to the memory cell string. As illustrated in FIG. 6A, the first memory group includes an $(n-1)^{th}$ memory cell MC(n-1) and an $n^{th}$ memory cell MCn; the second memory group includes a third memory cell MC3 to an $(n-2)^{th}$ memory cell MC(n-2); and the third memory group includes a first memory cell MC1 and a second memory cell MC2.

Figure 6B:
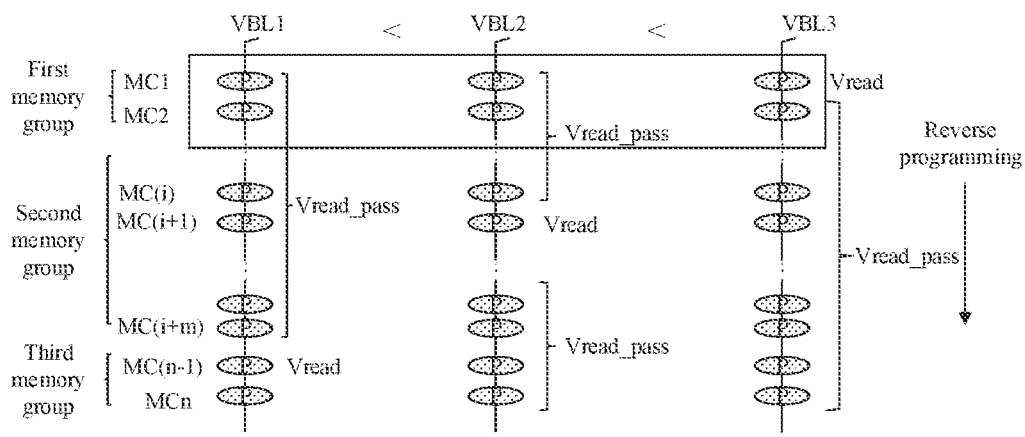
FIG. 6B illustrates a schematic diagram of a reading operation performed after reverse programming of a memory cell string respectively according to embodiments of the disclosure.
Figure 7:
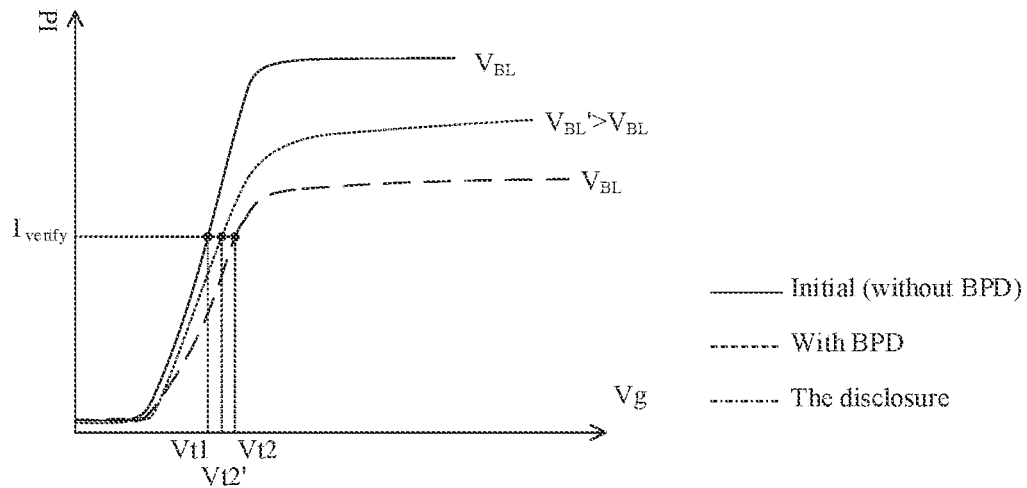
FIG. 7 illustrates a schematic diagram of a characteristic curve under a reading operation of a 3D memory device.

When the programming sequence is a reverse programming sequence, the first memory group is close to the top selection gate (TSG), and the third memory group is close to the bottom selection gate (BSG). The closer to the top selection gate (TSG) the memory cell selected for the reading operation, the greater the bit line voltage applied to the memory cell string. As illustrated in FIG. 6B, the first memory group includes the first memory cell MC1 and the second memory cell MC2; the second memory group includes the third memory cell MC3 to the $(n-2)^{th}$ memory cell MC(n-2); the third memory group includes the $(n-1)^{th}$ memory cell MC(n-1) and the $n^{th}$ memory cell MCn.

In S22, in response to that a memory cell selected for the reading operation is in the first memory group, a first bit line voltage is applied to the one of the multiple memory cell strings.

In S23, in response to that the memory cell selected for the reading operation is in the second memory cell group, a second bit line voltage is applied to the one of the multiple memory cell strings.

In S24, in response to that the memory cell selected for the reading operation is in the third memory cell group, a third bit line voltage is applied to the one of the multiple memory cell strings.

In this embodiment, the first bit line voltage VBL1, the second bit line voltage VBL2, and the third bit line voltage VBL3 are different in amplitude. Since the first memory group is to be programmed first and the third memory group is to be programmed finally, the first line voltage VBL1 is greater than the second bit line voltage VBL2 and the second bit line voltage VBL2 is greater than the third bit line voltage VBL3. That is, VBL1>VBL2>VBL3.

In an exemplary embodiment, the third bit line voltage VBL3 is equal to a bit line voltage VBL used in programming verification.

In the method for reading a 3D memory device according to the embodiments of the disclosure, when memory cells are read, different bit line voltages are applied to the memory cell string according to the programming sequence of the memory cells respectively. When the programming sequence of the memory cell is earlier, a greater bit line voltage is applied to the memory cell string during the reading operation on the memory cell, to increase the current on the memory cell string. Thus, forward drift and widening of Vt caused by the BPD effect are reduced, so as to increase reading window margins, and reduce the impact of read disturbance (read disturb).

Figure 8:
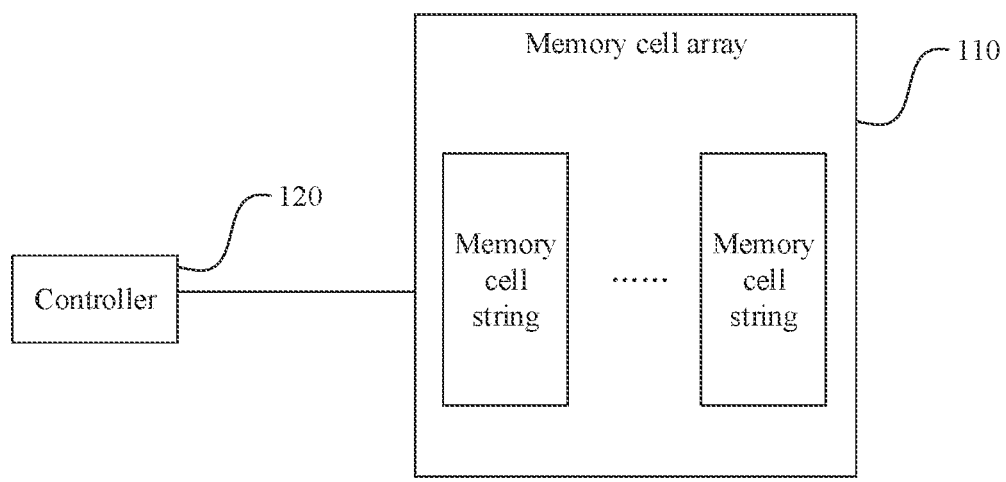
FIG. 8 illustrates a schematic structural diagram of a 3D memory device according to embodiments of the disclosure.

FIG. 8 illustrates a 3D memory device according to the embodiments of the disclosure. The 3D memory device includes: a memory cell array 110 and a controller 120. The controller 120 is configured to perform the above reading method.

The memory cell array 110 includes multiple memory cell strings, and each memory cell string includes multiple memory cells MC1-MCn. A topmost memory cell in each memory cell string is connected to a top selection gate (TSG) that is connected to a bit line (BL), and a bottommost memory cell in each memory cell string is connected to a bottom selection gate.

The controller 120 is electrically connected to the memory cell array 110, and is configured to: sequentially program multiple memory cells in one of the multiple memory cell strings according to a programming sequence. In performing a reading operation on a memory cell in the one of the multiple memory cell strings, the controller is configured to: apply a corresponding bit line voltage to the one of the multiple memory cell strings according to a programming sequence of the memory cell.

In this embodiment, a forward programming sequence is from bottom to top, namely, to start programming from a memory cell closest to a bottom selection gate (BSG) and end at a memory cell closest to a top selection gate (TSG), that is, successively programming from the memory cell adjacent to the bottom selection gate (BSG) to the memory cell adjacent to the top selection gate (TSG). A reverse programming sequence is from top to bottom, namely, to start programming from the memory cell closest to the top selection gate (TSG) and end at the memory cell closest to the bottom selection gate (BSG), that is, successively programming from the memory cell adjacent to the top selection gate (TSG) to the memory cell adjacent to the bottom selection gate (BSG).

In this embodiment, the earlier the programming sequence of a memory cell, the greater the bit line voltage applied to the memory cell string during the reading operation on the memory cell by the controller 120. When the selected memory cell is read, a read voltage Vread is applied to the word line connected to the selected memory cell, and a pass voltage Vread_Pass is applied to the word lines connected to the other unselected memory cells.

In an exemplary embodiment, the controller 120 is further configured to: divide the multiple memory cells into a first memory group, a second memory group, and a third memory group according to a programming sequence of the multiple memory cells in the one of the memory cell strings. The first memory group is to be programmed first, the second memory group is to be programmed in the middle, and the third memory group is to be programmed finally. The controller 120 is further configured to: in response to that a memory cell selected for the reading operation is in the first memory cell group, apply a first bit line voltage to the one of the multiple memory cell strings. In some embodiments, the controller 120 is further configured to: in response to that the memory cell selected for the reading operation is in the second memory cell group, apply a second bit line voltage to the one of the multiple memory cell strings. In some embodiments, the controller 120 is further configured to: in response to that the memory cell selected for the reading operation is in the third memory cell group, apply a third bit line voltage to the one of the multiple memory cell strings. The first bit line voltage, the second bit line voltage and the third bit line voltage are different in amplitude.

In this embodiment, when the programming sequence is a forward programming sequence, the first memory group is close to the bottom selection gate (BSG), and the third memory group is close to the top selection gate (TSG). The closer to the bottom selection gate (BSG) the memory cell selected for the reading operation, the greater the bit line voltage applied to the memory cell string. As illustrated in FIG. 6A, the first memory group includes the $(n-1)^{th}$ memory cell MC(n-1) and the $n^{th}$ memory cell MCn; the second memory group includes the third memory cell MC3 to the $(n-2)^{th}$ memory cell MC(n-2); and the third memory group includes the first memory cell MC1 and the second memory cell MC2.

When the programming sequence is a reverse programming sequence, the first memory group is close to the top selection gate (TSG), and the third memory group is close to the bottom selection gate (BSG). The closer to the top selection gate (TSG) the memory cell selected for the reading operation, the grater the bit line voltage applied to the memory cell string. As illustrated in FIG. 6B, the first memory group includes the first memory cell MC1 and the second memory cell MC2; the second memory group includes the third memory cell MC3 to the $(n-2)^{th}$ memory cell MC(n-2); the third memory group includes the $(n-1)^{th}$ memory cell MC(n-1) and the $n^{th}$ memory cell MCn.

In this embodiment, the first bit line voltage VBL1, the second bit line voltage VBL2, and the third bit line voltage VBL3 are different in amplitude. Since the first memory group is to be programmed first and the third memory group is to be programmed finally, the first line voltage VBL1 is greater than the second bit line voltage VBL2, and the second bit line voltage VBL2 is greater than the third bit line voltage VBL3. That is, VBL1>VBL2>VBL3.

In an exemplary embodiment, the third bit line voltage VBL3 is equal to a bit line voltage VBL used in programming verification.

In a 3D memory device according to the embodiments of the disclosure, when memory cells are read, different bit line voltages are applied to the memory cell string according to the programming sequence of the memory cells respectively. When the programming sequence of the memory cell is earlier, a greater bit line voltage is applied to the memory cell string during the reading operation on the memory cell, to increase the current on the memory cell string. Thus, the forward drift and widening of Vt caused by the BPD effect are reduced, so as to increase reading window margins, and reduce the impact of read disturbance (read disturb).

In the above description, there is no detailed description for technique details such as the composition of each layer, and etching. However, those of ordinary skill in the art would appreciate that the desired layers, regions, and the like can be formed by various technical means. In addition, in order to form the same structure, those of ordinary skill in the art would also design methods that are not exactly the same as those described above. Furthermore, although various embodiments are described above separately, it does not mean that the measures in the various embodiments cannot be used advantageously in combination.

The embodiments of the disclosure are described above. However, these embodiments are illustrative only, but do not limit the scope of the disclosure. The scope of the disclosure is defined by the appended claims and their equivalents. Those of ordinary skill in the art would make many substitutions and modifications without departing from the scope of the disclosure, which shall be within the scope of the disclosure.

The invention claimed is:

1. A method for reading a three-dimensional (3D) memory device, wherein the 3D memory device comprises memory cell strings, each memory cell string comprises memory cells, a topmost memory cell in each memory cell string is connected to a top selection gate that is connected to a bit line, a bottommost memory cell in each memory cell string is connected to a bottom selection gate, and the method comprises:
  sequentially programming memory cells in one of the memory cell strings according to a programming sequence;
  dividing the memory cells in the one of the memory cell strings into memory groups according to the programming sequence, wherein a number of the memory groups is less than or equal to a number of memory cells in the one of the memory cell strings; and
  in performing a reading operation on a memory cell in the one of the memory cell strings, applying a corresponding hit line voltage to the one of the memory cell strings according to a programming sequence of a memory group to which the memory cell belongs,
  wherein the earlier the programming sequence of the memory group to which the memory cell belongs, the greater the corresponding hit line voltage applied to the one of the memory cell strings during the reading operation.

2. The method according to claim 1, wherein the dividing the memory cells in the one of the memory cell strings into memory groups according to the programming sequence comprises:
  dividing the memory cells in the one of the memory cell strings into a first memory group, a second memory group, and a third memory group according to a programming sequence of the memory cells, wherein the first memory group is to be programmed first, the second memory group is to be programmed in middle, and the third memory group is to be programmed finally; and
  in response to a memory cell selected for the reading operation is in a first memory cell group, applying a first bit line voltage to the one of the memory cell strings; or in response to the memory cell selected for the reading operation is in a second memory cell group, applying a second hit line voltage to the one of the memory cell strings; or in response to the memory cell selected for the reading operation is in a third memory cell group, applying a third bit line voltage to the one of the memory cell strings.

3. The method according to claim 2, wherein the third bit line voltage is equal to a bit line voltage used in programming verification.

4. The method according to claim 1, wherein the programming sequence is a forward programming sequence, and sequentially programming the memory cells in the one of the memory cell strings according to the programming sequence comprises:
  sequentially programming the memory cells in the one of the memory cell strings starting from a memory cell adjacent to the bottom selection gate to a memory cell adjacent to the top selection gate,
  wherein in performing the reading operation on the memory cell in the one of the memory cell strings, the closer to the bottom selection gate the memory group to which the memory cell selected for the reading operation belongs, the greater the bit line voltage applied to the one of the memory cell strings.

5. The reading method according to claim 1, wherein the programming sequence is a reverse programming sequence, and sequentially programming the memory cells in the one of the memory cell strings according to a programming sequence comprises:
  sequentially programming the memory cells in the one of the memory cell strings starting from a memory cell adjacent to the top selection gate to a memory cell adjacent to the bottom selection gate,
  wherein in performing the reading operation on the memory cell in the one of the memory cell strings, the closer to the top selection gate the memory group to which the memory cell selected for the reading operation belongs, the greater the bit line voltage applied to the one of the memory cell strings.

6. A three-dimensional (3D) memory device, comprising:
a memory cell array comprising memory cell strings, each memory cell string comprising memory cells, wherein a topmost memory cell in each memory cell string is connected to a top selection gate that is connected to a bit line, and a bottommost memory cell in each memory cell string is connected to a bottom selection gate; and
a controller, electrically connected to the memory cell array, and configured to:
sequentially program memory cells in one of the memory cell strings according to a programming sequence;
divide the memory cells in the one of the memory cell strings into memory groups according to the programming sequence, wherein a number of the memory groups is less than or equal to a number of memory cells in the one of the memory cell strings; and
in performing a reading operation on a memory cell in the one of the memory cell strings, apply a corresponding bit line voltage to the one of the memory cell strings according to a programming sequence of a memory group to which the memory cell belongs, wherein the earlier the programming sequence of the memory group to which the memory cell belongs, the greater the bit line voltage applied to the one of the memory cell strings during the controller performs the reading operation on the memory cell.

7. The 3D memory device according to claim 6, wherein the controller is further configured to:
divide the memory cells into a first memory group, a second memory group, and a third memory group according to a programming sequence of the memory cells in the one of the memory cell strings, wherein the first memory group is to be programmed first, the second memory group is to be programmed in middle, and the third memory group is to be programmed finally; and
in response to a memory cell selected for the reading operation is in a first memory cell group, apply a first bit line voltage to the one of the memory cell strings; or in response to the memory cell selected for the reading operation is in a second memory cell group, apply a second bit line voltage to the one of the memory cell strings; or in response to the memory cell selected for the reading operation is in a third memory cell group, apply a third bit line voltage to the one of the memory cell strings.

8. The 3D memory device according to claim 7, wherein the third bit line voltage is equal to a bit line voltage used in programming verification.

9. The 3D memory device according to claim 6, wherein the programming sequence is a forward programming sequence, and in sequentially programming the memory cells in the one of the memory cell strings according to the programming sequence, the controller is configured to:
sequentially program the memory cells in the one of the memory cell strings starting from a memory cell adjacent to the bottom selection gate to a memory cell adjacent to the top selection gate,
wherein in performing the reading operation on the memory cell in the one of the memory cell strings, the closer to the bottom selection gate the memory group to which the memory cell selected for the reading operation belongs, the greater the bit line voltage applied to the one of the memory cell strings by the controller.

10. The 3D memory device according to claim 6, wherein the programming sequence is a reverse programming sequence, and in sequentially programming the memory cells in the one of the memory cell strings according to a programming sequence, the controller is configured to:
sequentially program the memory cells in the one of the memory cell strings starting from a memory cell adjacent to the top selection gate to a memory cell adjacent to the bottom selection gate,
wherein in performing the reading operation on the memory cell in the one of the memory cell strings, the closer to the top selection gate the memory group to which the memory cell selected for the reading operation belongs, the greater the bit line voltage applied the one of the memory cell strings by the controller.

* * * * *